(12) United States Patent
Lam et al.

(10) Patent No.: US 7,682,945 B2
(45) Date of Patent: Mar. 23, 2010

(54) PHASE CHANGE ELEMENT EXTENSION EMBEDDED IN AN ELECTRODE

(75) Inventors: Chung H. Lam, Peekskill, NY (US); Matthew J. Breitwisch, Yorktown Heights, NY (US); Roger W. Cheek, Somers, NY (US); Alejandro G. Schrott, New York, NY (US); Matthew D. Moon, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 12/025,333

(22) Filed: Feb. 4, 2008

(65) Prior Publication Data

US 2009/0194757 A1 Aug. 6, 2009

(51) Int. Cl.
*H01L 21/20* (2006.01)
(52) U.S. Cl. .................. 438/479; 438/482; 438/900; 365/148; 257/2; 257/3; 257/52; 257/E31.034
(58) Field of Classification Search .......... 257/2–5, 257/52, E31.034; 365/148; 438/479, 482, 438/900
See application file for complete search history.

(56) References Cited

U.S. PATENT DOCUMENTS

2009/0072215 A1* 3/2009 Lung et al. .............. 257/4

* cited by examiner

*Primary Examiner*—Evan Pert
*Assistant Examiner*—Scott R Wilson
(74) *Attorney, Agent, or Firm*—Scully, Scott, Murphy & Presser, P.C.; Vazken Alexanian (57) ABSTRACT

The present invention in one embodiment provides a method of forming a memory device that includes providing an interlevel dielectric layer including a conductive stud having a first width; forming an stack comprising a metal layer and a first insulating layer; forming a second insulating layer atop portions of the interlevel dielectric layer adjacent each sidewall of the stack; removing the first insulating layer to provide a cavity; forming a conformal insulating layer atop the second insulating layer and the cavity; applying an anisotropic etch step to the conformal insulating layer to produce a opening having a second width exposing an upper surface of the metal layer, wherein the first width is greater than the second width; and forming a memory material layer in the opening.

20 Claims, 4 Drawing Sheets

PHASE CHANGE ELEMENT EXTENSION EMBEDDED IN AN ELECTRODE

FIELD OF THE INVENTION

The present invention in one embodiment relates to memory devices.

BACKGROUND OF THE INVENTION

In semiconductor and memory device applications, an electrode is a conductor through which electric current is passed. The electrode is typically comprised of a metal, such as copper, tungsten, silver, lead, or zinc. The electrode may also be in the form of a nonmetallic conductor, including a semiconducting material, such as doped polysilicon. Phase change random access memory (PRAM) devices store data using a phase change material, such as, for example, a chalcogenide alloy, that transforms into a crystalline state or an amorphous state or vice versa during heat treatments or during quench following heat treatments. Each state of the phase change material has different resistance characteristics. Typically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1". In some phase change random access memory devices, electrodes supply energy, i.e., heat, to the phase change material to induce phase changes.

SUMMARY OF THE INVENTION

In one aspect, the present invention provides a method of forming a memory device. In one embodiment, the inventive method includes:
providing an interlevel dielectric layer comprising a conductive stud having a first width;
forming a stack comprising a metal layer atop the conductive stud, and a first insulating layer overlying the metal layer;
forming a second insulating layer atop portions of the interlevel dielectric layer adjacent each sidewall of the stack, wherein an upper surface of the second insulating layer is coplanar with an upper surface of the first insulating layer;
removing the first insulating layer to provide a cavity;
forming a conformal insulating layer atop the second insulating layer and the cavity;
applying a substantially anisotropic etch step to the conformal insulating layer to produce an opening having a second width exposing an upper surface of the metal layer, wherein the first width is greater than the second width; and
forming a memory material layer in the opening.

In one embodiment of the method for forming a memory device, the stack further includes an etch stop layer positioned between the metal layer and the first insulating layer, wherein during the step of removing the first insulating layer to provide the cavity the etch process to remove the first insulating layer is selective to the etch stop layer. In one embodiment, the stack has a third width that is greater than the first width of the conductive stud.

In one embodiment of the above described method for forming a memory device, the step of forming the second insulating layer having an upper surface coplanar with the upper surface of the stack includes depositing the second insulating layer by high density chemical vapor deposition atop the stack and the interlevel dielectric layer, and planarizing the second insulating layer until the upper surface of the first insulating layer is exposed. In one embodiment, planarization of the second insulating layer is provided by chemical mechanical polishing.

In one embodiment of the method for forming a memory device, the step of removing the first insulating layer to provide the cavity includes etching the first insulating layer selective to the etch stop layer, wherein the sidewalls of the cavity are defined by the second insulating layer and the base of the cavity is the upper surface of the etch stop layer. In one embodiment, the first insulating layer is a nitride, the second insulating layer is an oxide, and the etch stop layer is an oxide.

In one embodiment of the method for forming a memory device, the step of forming the memory material layer includes depositing a phase change material by chemical vapor deposition or physical vapor deposition, wherein the phase change material may be composed of Ge, Sb, Te or a combination thereof. In one embodiment, a barrier metal layer may be formed atop the phase change material, wherein the barrier metal layer may be deposited by chemical vapor deposition or physical vapor deposition, such as sputtering. In one embodiment, the barrier metal layer may be composed of TiN, TaN, WN, or combinations thereof. In one embodiment, the phase change material and the barrier metal layer may be patterned and etched to provide a barrier metal/phase change material stack.

In one embodiment, following the formation of the barrier metal/phase change material stack, a passivation layer, such as an oxide passivation layer, may be deposited atop the barrier metal/phase change material stack and the interlevel dielectric layer. In one embodiment, the passivation layer may be patterned and etched to provide vias exposing the upper surface of the barrier metal/phase change material stack, wherein the vias provide the location for subsequently formed conductive lines which will be formed through the passivation layer to the memory device. In one embodiment, the conductive lines are composed of copper, tungsten, aluminum, silver, gold or alloys thereof.

In another aspect, the present invention provides a memory device. In one embodiment, the memory device includes:
an electrode;
an isolation region; and
a phase change material comprising a body of a first width and an extension having a second width, wherein a portion of the extension is in direct physical contact with the electrode and the body of the phase change element is separated from the electrode by the isolation region.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel memory devices and methods of forming memory devices. When describing the methods and structures, the following terms have the following meanings, unless otherwise indicated.

As used herein, the term "memory device" means a structure in which the electrical state of which can be altered and then retained in the altered state; in this way a bit of information can be stored.

As used herein, the term "resistive memory device" denotes a device whose effective electrical resistivity can be switched between two or more resistivities (ohms) upon an application of an energy pulse, such as a voltage or current pulse. Pulse time may range from approximately 5 to approximately 100 nano-seconds.

As used herein, the term "phase change material memory device" denotes a memory device including a memory cell composed of a phase change material.

As used herein, a "phase change material" denotes a material that converts from a first phase to a second phase and/or vice versa upon the application of energy.

As used herein, the terms "insulating" and "dielectric" denote a non-metallic material having a room temperature conductivity of less than about $10^{-10}(\Omega\text{-m})^{-1}$.

As used herein, the term "Si containing substrate" refers to a substrate including at least Si, or a layer formed atop a device substrate, including at least Si.

As used herein, a "barrier metal" is an electrically conductive material used to chemically isolate metals from dielectric and other metals.

A "via" is a hole etched in a dielectric which is then filled with a conductive material or semiconducting material to provide connection between stacked interconnect metal lines or interconnect metal lines and devices.

The term "direct physical contact" means that a first structure and a second structure are positioned in contact without any intermediary conducting, insulating or semiconducting layer at the interface of the two structures.

"Electrically conductive" and/or "electrically communicating" as used through the present disclosure means a material having a room temperature conductivity of greater than $10^{-8}(\Omega\text{-m})^{-1}$.

The term "electrical contact" denotes contact between two materials, wherein the interface between the two materials is electrically conductive.

"Chemical Vapor Deposition" is a deposition process in which a deposited species is formed as a result of chemical reaction between gaseous reactants at greater than room temperature; wherein solid product of the reaction is deposited on the surface on which a film, coating, or layer of the solid product is to be formed.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

Figure 1A:
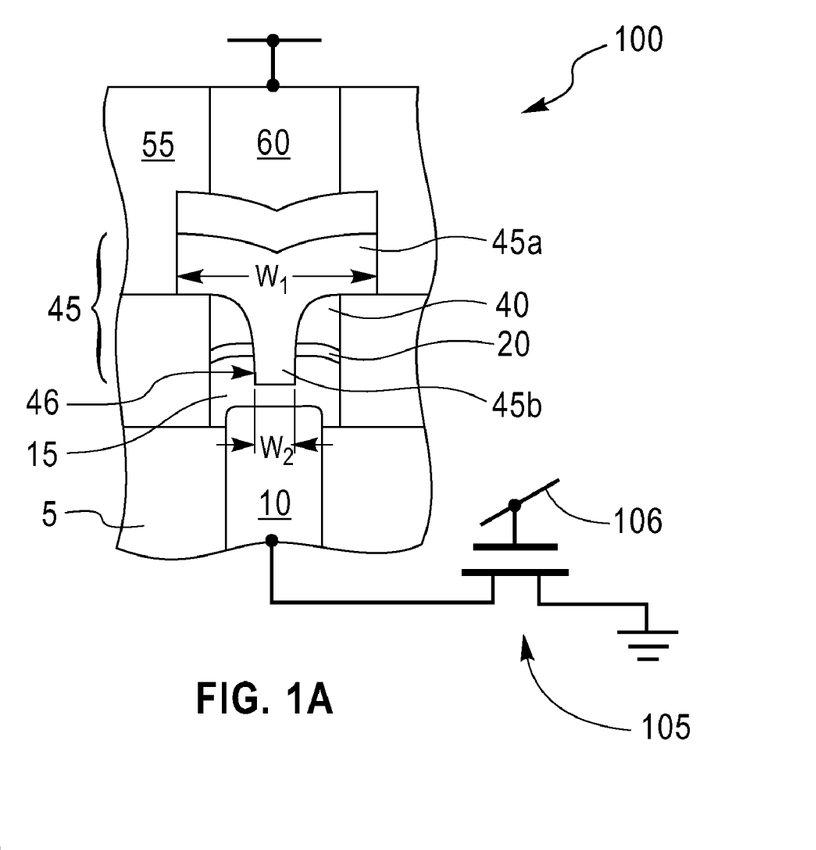
FIG. 1A is a side cross sectional view of a memory device, in accordance with one embodiment of the present invention.
Figure 1B:
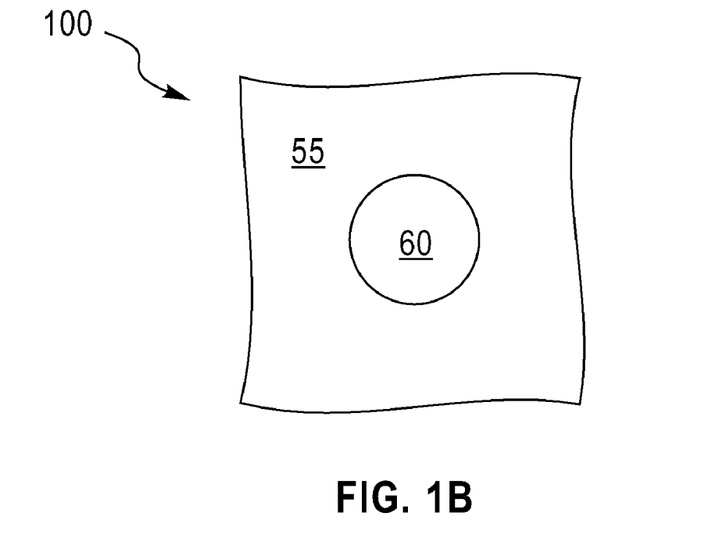
FIG. 1B is a planar top view of the memory device depicted in FIG. 1A.

FIGS. 1A and 1B depict one embodiment of a memory device 100, in accordance with the present invention. It is noted that although the following description relates to a phase change memory device, other types of memory devices having been contemplated and are within the scope of the present invention, such as resistive memory devices.

In one embodiment, the memory device 100 includes at least an electrode 15; at least one isolation region, such as an etch stop layer 20; and a phase change material 45 including a body 45a of a first width $W_1$ and an extension 45b having a second width $W_2$, wherein a portion of the extension 45b is in direct physical contact with the electrode 15 and the body 45a of the phase change material 45 is separated from the electrode 15, by at least one isolation region, such as the etch stop layer 20. In one embodiment of the memory device, the first width $W_1$ of the body 45a of the phase change material 45 is greater than the second width $W_2$ of the extension 45b of the phase change material 45, wherein the first width $W_1$ may range from about 10 nm to about 100 nm; and the second width $W_2$ may range from about 40 nm to about 300 nm.

In one embodiment, the portion of the phase change material 45 that provides the extension 45b is defined by the portion of the phase change material 45 that extends beyond the lower surface of the etch stop layer 20. In one embodiment, the portion of the phase change material 45 that provides the body 45a is defined by the portion the phase change material 45 above the etch stop layer 20. In one embodiment, the extension 45b is embedded in the electrode 15. The term "embedded" means that at least a portion of the extension sidewall 46 is in electrical contact with the electrode 15.

Referring to FIG. 1B, although the memory device 100 is depicted in a circular opening, other geometries have been contemplated and are within the present invention including but not limited to an elliptical geometry, as well as multi-sided opening geometries.

Figure 2:
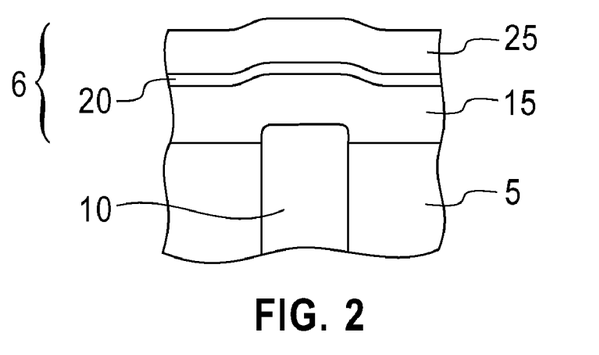
FIG. 2 is a side cross sectional view of an initial structure including an interlevel dielectric layer having at least one conductive stud, a metal layer atop the interlevel dielectric layer, an etch stop layer atop the metal layer, and a first insulating layer atop the etch stop layer, as used in accordance with one embodiment of the present invention.

FIGS. 2-9 depict one embodiment of a process flow for manufacturing a memory device 100, in accordance with the present invention. FIG. 2 depicts one embodiment of an initial structure including an interlevel dielectric layer 5 including at least one conductive stud, i.e., a metal stud; a metal layer 15 atop the interlevel dielectric layer 5, a etch stop layer 20 atop the metal layer 15, and a first insulating layer 25 atop the etch stop layer 20. In one embodiment, the interlevel dielectric layer 5 is positioned atop a substrate 2.

Referring to FIG. 2, in one embodiment, the substrate 2 may include any number of active and/or passive devices (or regions) located within the substrate 2 or on a surface thereof. For clarity, the active and/or passive devices (or regions) are not shown in the drawings, but are nevertheless meant to be included with substrate 2. For example, the substrate 2 may comprise any semiconductor material including, but not limited to: Si, Ge, SiGe, SiC, SiGeC, InAs, GaAs, InP and other III/V compound semiconductors. The substrate 2 may be undoped, or doped. In one example, the substrate is a Si-containing substrate, and the doping of the Si-containing substrate may be light (having a dopant concentration of less than 1E17 atoms/cm$^3$) or heavy (having a dopant concentration of about 1E17 atoms/cm$^3$ or greater). The substrate 2 can have any crystallographic orientation such as (100), (110) or (111). Hybrid substrates having at least two planar surfaces of different crystallographic orientation are also contemplated.

In one embodiment, the present method may begin following front end of the line (FEOL) processing, in which the interlevel dielectric layer 5 is a component of a device interconnect level, wherein the interlevel dielectric layer 5 includes at least one opening that is filled with at least one conductive material to provide a conductive stud 10 through the interlevel dielectric layer 5, such as a metal stud. In one embodiment, the conductive stud 10, i.e., metal stud, provides electrical communication to an access transistor 105 that is formed in the underlying substrate 2, wherein the gate of the access transistor may be in electrical communication with a word line 106, as depicted in FIG. 1A. In one embodiment, the width $W_3$ of the conductive stud 10 may range from about 100 nm to about 300 nm in diameter. In another embodiment, the width $W_3$ of the conductive stud 10 is on the order of about 200 nm.

In one embodiment, the interlevel dielectric layer 5 is formed atop the substrate 2 using deposition, etching and planarization. More specifically, in one embodiment of the invention, the interlevel dielectric layer 5 is formed atop the substrate 2 by a deposition process including, i.e., chemical vapor deposition (CVD), plasma-assisted CVD, evaporation, spin-on coating, or chemical solution deposition. The interlevel dielectric layer 5 may include any suitable insulating material that is typically employed in interconnects to electrical devices. This includes inorganic dielectrics, organic dielectrics and combinations thereof, including, multilayers thereof. Illustrative examples of suitable materials for interlevel dielectric layer 5 include, but are not limited to: $SiO_2$, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

In one embodiment, the interlevel dielectric layer 5 comprises an oxide having a thickness ranging from about 10 nm to about 1000 nm. In another embodiment, the interlevel dielectric layer 5 has a thickness ranging from about 25 nm to about 500 nm. In yet another embodiment, the interlevel dielectric layer 5 has a thickness on the order of about 300 nm. In one embodiment, the dielectric constant of the interlevel dielectric layer 5 is less than about 3.5. In another embodiment, the interlevel dielectric layer 5 has a dielectric constant that may range from about 1.0 to about 3.0. Low-k dielectrics may include organic dielectrics such as low dielectric constant polymer dielectrics or may include low dielectric constant carbon-doped oxides. One example of a low-k dielectric polymer dielectric is SiLK™ (trademark of The Dow Chemical Company). Specifically, SiLK™ is a class of polymer-based low-k dielectric materials comprising a b-staged polymer having a composition including about 95% carbon. An example of a low dielectric constant carbon doped oxide is SiCOH.

After forming the interlevel dielectric layer 5, lithography and etch processes are utilized to form openings extending into the interlevel dielectric 5 into which conductive studs 10, such as metal studs, are subsequently formed that may provide device interconnects. For example, a lithographic step may include applying a photoresist to the interlevel dielectric layer 5, exposing the photoresist to a pattern of radiation and developing the pattern into the exposed photoresist utilizing a resist developer. The etching step used in providing the openings in the interlevel dielectric layer 5 may include chemical reactive ion etching (RIE), plasma etching, ion beam etching or laser ablation. Following etching, the photoresist is typically removed. In one embodiment, the conductive studs 10, such as metal studs, are then formed within the openings in the interlevel dielectric layer 5 using deposition and planarization processes. In one embodiment, the conductive studs 10 may be formed within the opening by depositing a metal, such as Cu or W, wherein the deposition process may include chemical vapor deposition, plating or sputtering. After filling the vias with a conductive material, the structure is typically subjected to a planarization process, such as chemical-mechanical polishing or grinding, to provide a substantially planar structure.

Still referring to FIG. 2, in a following process step a metal layer 15 is formed atop the interlevel dielectric layer 5 and the conductive stud 10. In one embodiment, the metal layer 15 may be composed of a metal nitride. In another embodiment, the metal layer 15 may be composed of a barrier metal. In a further embodiment, the metal layer 15 may be composed of TiN, WN or TaN. In yet another embodiment, the metal layer 15 may be composed of TaSiN. In one embodiment, the metal layer 15 is formed by physical vapor deposition. In one embodiment, physical vapor deposition may include plating or sputtering. In another embodiment, the metal layer 15 may be formed by chemical vapor deposition. In one embodiment, the metal layer 15 may have a thickness ranging from about 20 nm to about 150 nm. In one embodiment in which the metal layer 15 is composed of TiN, the metal layer 15 may be deposited by physical vapor deposition to a thickness of approximately 100 nm.

In a following process step, an etch stop layer 20 is formed atop the metal layer 15. In one embodiment, the etch stop layer 20 may be composed of an oxide, nitride, or oxynitride. In one embodiment in which the etch stop layer 20 is an oxide, the oxide may include $SiO_2$. In one embodiment, the etch stop layer 20 is formed by Chemical Vapor Deposition (CVD). Chemical Vapor Deposition (CVD) is a deposition process in which a deposited species is formed as a result of chemical reaction between gaseous reactants at an elevated temperature, i.e, ranging from 250° C. to 650° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. Additionally, the etch stop layer 20 may be formed using a growth process, such as thermal oxide growth or nitridization.

In one embodiment, the etch stop layer 20 may have a thickness ranging from about 5 nm to about 50 nm. In one embodiment, the etch stop layer 20 may be composed of $SiO_2$ deposited by Plasma Enhanced Chemical Vapor Deposition (PECVD) to a thickness of about 10 nm. Plasma Enhanced Chemical Vapor Deposition (PECVD) is a form of chemical vapor deposition that utilizes a plasma to enhance chemical reaction rates of the precursors allowing for deposition at temperatures ranging from about 250° C. to about 350° C. It is noted that other compositions and thicknesses for the etch stop layer 20 are contemplated and are within the scope of the invention, so long as the selected composition and thickness is sufficient to maintain etch selectivity to etch stop layer 20 while removal of the subsequently formed first insulating layer 25.

In a following process step, a first insulating layer 25 is deposited atop the etch stop layer 20. Similar to the interlevel dielectric layer 5, the first insulating layer 25 may include any suitable insulating material that is typically employed in interconnects to electrical devices, so long as the composition of the first insulating layer 25 may be differentiated from the etch stop layer 20 for selective etch purposes. In one embodiment, when the etch stop layer 20 is composed of an oxide, such as $SiO_2$, the first insulating layer 25 is composed of a nitride, such as SiN. In one embodiment, the first insulating layer 25 may be deposited by Chemical Vapor Deposition (CVD). Variations of CVD include but are not limited to Atmospheric Pressure CVD (APCVD), Low Pressure CVD (LPCVD) and Plasma Enhanced CVD (EPCVD), Metal-Organic CVD (MOCVD) and others.

In one embodiment, the thickness of the first insulating layer 25 may range from about 100 nm to about 500 nm. In one embodiment, the first insulating layer 25 is composed of $Si_3N_4$ and is deposited by PECVD to a thickness on the order of about 200 nm. It is noted that other composition and thickness for the first insulating layer 25 are contemplated and are within the scope of the invention, so long as the selected composition and thickness of the first insulating layer 25 is sufficient to maintain etch selectivity to the etch stop layer 20 during subsequent etch steps.

Figure 3:
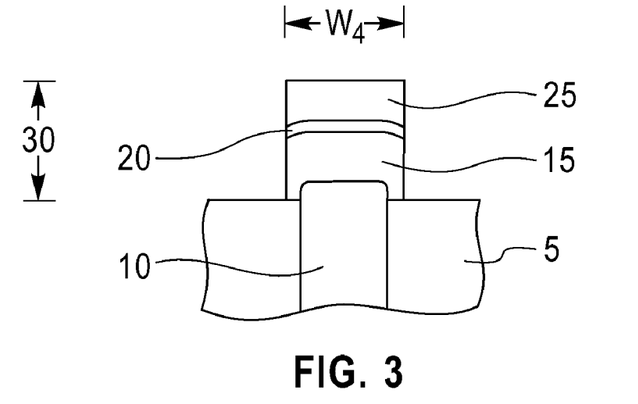
FIG. 3 is a side cross sectional view depicting patterning and etching of the structure depicted in FIG. 2 to provide a first insulating layer/etch stop layer/metal layer stack, in accordance with one embodiment of the present invention.

FIG. 3 depicts one embodiment of patterning and etching of the first insulating layer 25, the etch stop layer 20, and the metal layer 15 to provide a first insulating layer/etch stop layer/metal layer stack 30, in accordance with the present invention. In one embodiment, the first insulating layer/etch stop layer/metal layer stack 30 is provided by applying photolithography and etch process. More specifically, in one embodiment, a pattern is produced by applying a photoresist to the upper surface of first insulating layer 25, exposing the photoresist to a pattern of radiation and then developing the pattern into the photoresist utilizing resist developer. Once the patterning of the photoresist is completed, the sections covered by the photoresist are protected, while the exposed regions are removed using a selective etching process that removes the unprotected regions. In one embodiment, an anisotropic etch process is utilized to remove the unprotected regions of the first insulating layer 25, the etch stop layer 20, and the metal layer 15 to provide a first insulating layer/etch stop layer/metal layer stack 30. In one embodiment, an anisotropic etch process is a multi-step selective etch, wherein the etch chemistry is selected to remove a first layer, i.e., the first insulating layer 25, without substantially etching a second underlying layer, i.e., the etch stop layer 20. In one embodiment, the first insulating layer/etch stop layer/metal layer stack 30 has a width W3 greater than the width of the underlying conductive stud 10.

Figure 4:
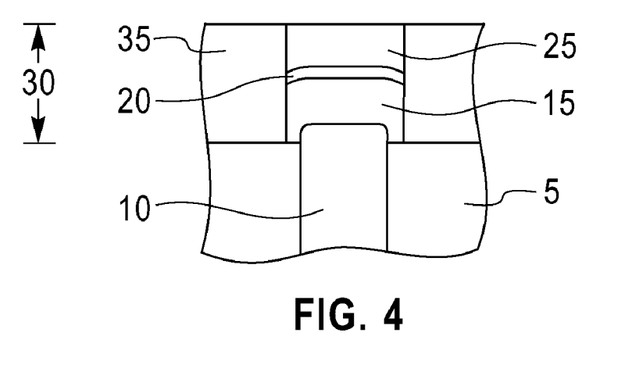
FIG. 4 is a side cross sectional view depicting forming a second insulating layer atop the first insulating layer/etch stop layer/metal layer stack and the interlevel dielectric layer; and planarizing the second insulating layer to produce an upper surface coplanar with the upper surface of the first insulating layer, in accordance with at least one embodiment of the present invention.

FIG. 4 is a side cross sectional view depicting one embodiment of forming a second insulating layer 35 atop portions of the interlevel dielectric layer 5 adjacent each sidewall of the stack 30, wherein the upper surface of the second insulating layer 35 is coplanar with an upper surface of the first insulating layer 25, in accordance with the present invention. It is noted that similar to the first insulating layer 25, the second insulating layer 35 may include any suitable insulating material that is typically employed in electrical devices, so long as the composition of the second insulating layer 35 may be differentiated from the first insulating layer 25 for selective etch purposes. In one embodiment, the second insulating layer 35 is composed of an oxide, such as $SiO_2$, when the etch stop layer 20 is composed of an oxide, such as $SiO_2$, and the first insulating layer 25 is composed of a nitride, such as SiN. In one embodiment similar to the first insulating layer 12, the second insulating layer 35 may be deposited by Chemical Vapor Deposition (CVD). In one embodiment, the second insulating layer 35 is an oxide, such as $SiO_2$, deposited by High Density Plasma (HDP) Chemical Vapor Deposition (CVD) atop the first insulating layer/etch stop layer/metal layer stack 30 and the interlevel dielectric layer 5. As used herein, the term "HDP Chemical Vapor Deposition" is a chemical vapor deposition process that utilizes a pressure ranging from about 2 mTorr to about 10 mTorr to achieve a an electron density ranging from about $10^{10}$ $cm^3$ to about $10^{12}$ $cm^3$, and a high fractional ionization rate ranging from about $10^{-4}$ to about $10^{-1}$ for deposition. In one embodiment following deposition, the second insulating layer 35 may be planarized to provide an upper surface being substantially coplanar with the upper surface of the first insulating layer 25, wherein planarizing may be provided by chemical mechanical polishing (CMP).

Figure 5:
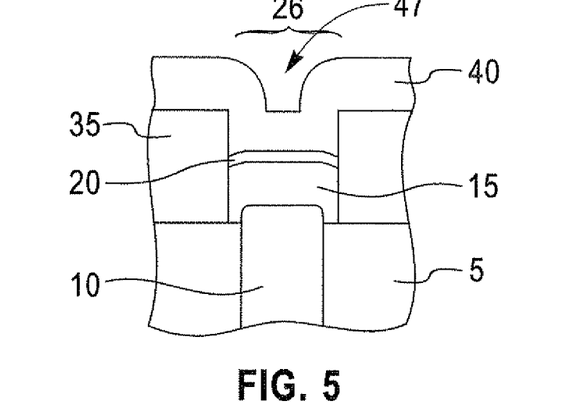
FIGS. 5 is a side cross sectional view depicting etching the first insulating layer selective to the etch stop layer to provide a cavity; and depositing a conformal insulating layer, in accordance with one embodiment of the present invention.

FIG. 5 depicts etching the first insulating layer 25 selective to the etch stop layer 20 to provide a cavity 26, and depositing a conformal insulating layer 40, in accordance with one embodiment of the present invention. In one embodiment, the etch process for removing the first insulating layer 25 is an anisotropic etch process. In one embodiment in which the first insulating layer 25 is SiN and the etch stop layer 20 is $SiO_2$, the etch process includes a reactive ion etch with an etch chemistry that includes $CF_4$ mixed with $O_2$ and $N_2$ to remove the nitride of the first insulating layer 25 selective to the oxide of the etch stop layer 20. Following the etch to remove the first insulating layer 25, a cavity 26 is provided in which the base of the cavity 26 is provided by the upper surface of the etch stop layer 20 and the sidewalls of the cavity 26 are provided by the second insulating layer 35.

In one embodiment, the conformal insulating layer 40 is deposited on at least the upper surface the second insulating layer 35, the sidewalls of the second insulating layer 35 and the upper surface of the etch stop layer 20. In one embodiment, the conformal insulating layer 35 is a deposited material having a thickness that remains the same regardless of the geometry of underlying features on which the layer is deposited, wherein the thickness of the layer does not deviate from greater than or less than 20% of an average value for the thickness of the layer. In one embodiment, the conformal insulating layer 35 is composed of an oxide $SiO_2$. In one embodiment, the conformal insulating layer 35 is composed of $SiO_2$ that is deposited by PECVD, wherein the thickness of the conformal insulating layer 35 is selected to provide a hole 47 centrally positioned in the cavity 26 having a diameter ranging from about 10 nm to about 100 nm. In another embodiment, the hole 47 has a diameter on the order of about 50 nm.

Figure 6:
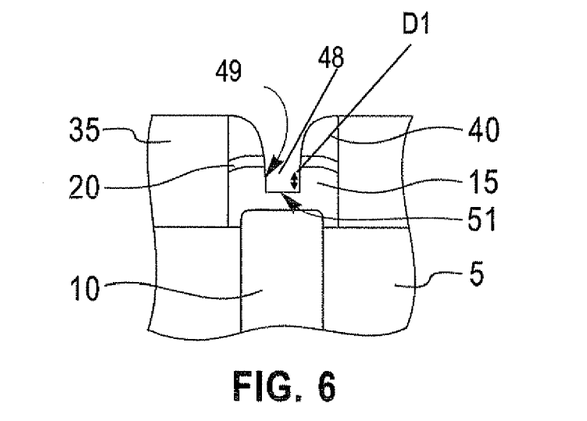
FIG. 6 is a side cross section view depicting applying an anisotropic etch to the conformal insulating layer to produce an opening having a width exposing an upper surface of the metal layer, in accordance with one embodiment the present invention.

FIG. 6 is a side cross section view depicting applying an anisotropic etch step to the conformal insulating layer 40 to produce an opening 48 having a width that exposes a surface of the metal layer 15, in accordance with one embodiment the present invention. In one embodiment, the hole acts an etch mask that when combined with the anisotropic etch step produces the opening 48 through the etch stop layer 20 extending into the metal layer 15. In one embodiment, a portion of the opening 48 is provided by recessing a portion of the upper surface of the metal layer 15, wherein the recessed surfaces of the metal layer 15 provide a lower portion of the opening sidewalls 49 and the base 51 of the opening 48. In one embodiment, the opening 48 extends to a depth $D_1$ ranging from about 5 nm to about 30 nm from the original upper surface of the metal layer 15 prior to etch. In one embodiment, the width $W_2$ of the opening ranges from about 10 nm to about 100 nm, as depicted in FIG. 1A.

Referring to FIGS. 5 and 6, in one embodiment, the hole 47 accelerates etching to the metal layer 15 when compared to remaining portion of the cavity 26 having a greater amount of conformal insulating layer 40, because the void provided by the hole 47 reduces the amount of material to be etched by the anisotropic etch step. In one embodiment in which the conformal insulating layer and the etch stop 20 are composed of an oxide and the metal layer 15 is composed of TiN, the chemistry of the anisotropic etch includes a reactive ion etch including an $Ar/O_2/C_4F_8/N_2$ dual frequency capacitive coupled plasma chemistry with flow ratio at 50:1:2:10. It is noted that other etch chemistries are possible, so long as the etch chemistry removes the conformal insulating layer 35 selective to the first insulating layer 25, followed by a high density chlorine: Ar plasma. In one embodiment, the anisotropic etch step may be timed.

Figure 7:
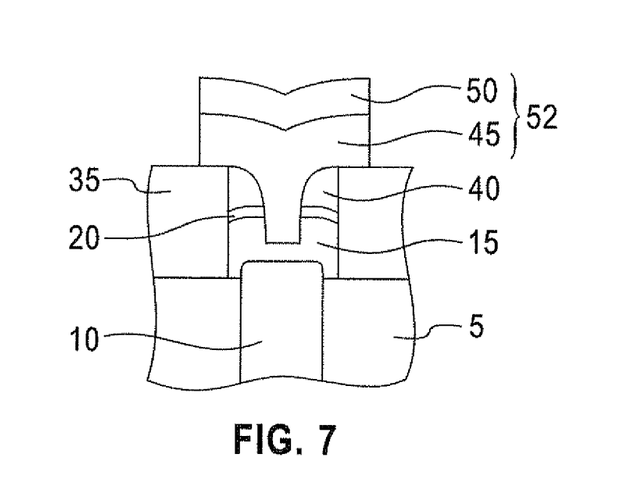
FIG. 7 is a side cross section view depicting forming a memory material layer in the opening; forming a barrier metal layer atop the memory material layer; and patterning and etching of the memory material layer and the barrier metal layer to provide a barrier metal/memory material stack, in accordance with one embodiment the present invention.

FIG. 7 depicts forming a memory material layer 45 in the opening 48; forming a barrier metal atop the memory material layer 45; and patterning and etching of the memory material layer 45 and the barrier metal layer 50 to provide a barrier metal/memory material stack 52, in accordance with one embodiment the present invention. In one embodiment, forming a memory material layer 45 includes depositing a phase change material 45 in electrical contact with the metal layer 15 through the opening 48. In one embodiment, the portion of the phase change material contained within the opening 48 and extending through the etch stop layer 20 is the extension portion 45b of the memory material layer 45.

In one embodiment, the phase change material may be switched from an amorphous phase to a crystalline phase and vice versa. When in an amorphous state, the phase change material exhibits a high resistivity, typically ranging from about $10^2$ ohm-m to about $10^4$ ohm-m. When in a crystalline state, the phase change material 45 is more conductive, exhibiting a lower resistivity typically ranging from about $10^{-5}$ ohm-m to about $10^{-2}$ ohm-m. In one embodiment, the phase change material may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material liner has a composition of $Ge_2Sb_2Te_5$ (GST). Although chalcogenides are a group of materials commonly utilized as phase change material, some phase change materials, such as GeSb, do not utilize, chalcogenides. Thus, a variety of materials can be used in a phase change material cell as long as they can retain separate amorphous and crystalline states of distinct resistivity.

In one embodiment, a phase change material is GST, and is in an amorphous phase when at a temperature of about 25° C. As the temperature of the GST phase change material is increased to a temperature ranging from about 125° C. to about 150° C., the resistivity of the phase change material decreases representing the transition temperature for a phase change from an amorphous phase to Face Center Cubic (FCC) phase. Further increases in the temperature of the GST phase change material to greater than about 180° C. result in further decreases in resistivity, which result from a phase change from the Face Centered Cubic (FCC) phase to a Hexagonal (Hex) phase of the GST. When the temperature of the GST phase change material is increased above the melting temperature (620° C.), the GST phase change material melts and upon quenching returns to the amorphous solid phase. Quenching denotes solidification in a time period on the order of about 0.5 to about 50 nanoseconds.

Still referring to FIG. 7, in one embodiment of the present invention a barrier metal layer 50 may be formed atop the memory material layer 45. In one embodiment the barrier metal layer 50 is TiN, TaN or a combination thereof. In one embodiment, the barrier metal layer 50 is blanket deposited by a physical deposition process, such as sputtering. In another embodiment, the barrier metal layer 50 may be deposited by chemical vapor deposition. In one embodiment, the barrier metal layer 50 may have a thickness ranging from about 20 nm to about 200 nm. Following deposition of the barrier metal layer 50, the barrier metal layer 50 and memory material layer 45 are pattered and etched to barrier metal/memory material stack 52.

Figure 8:
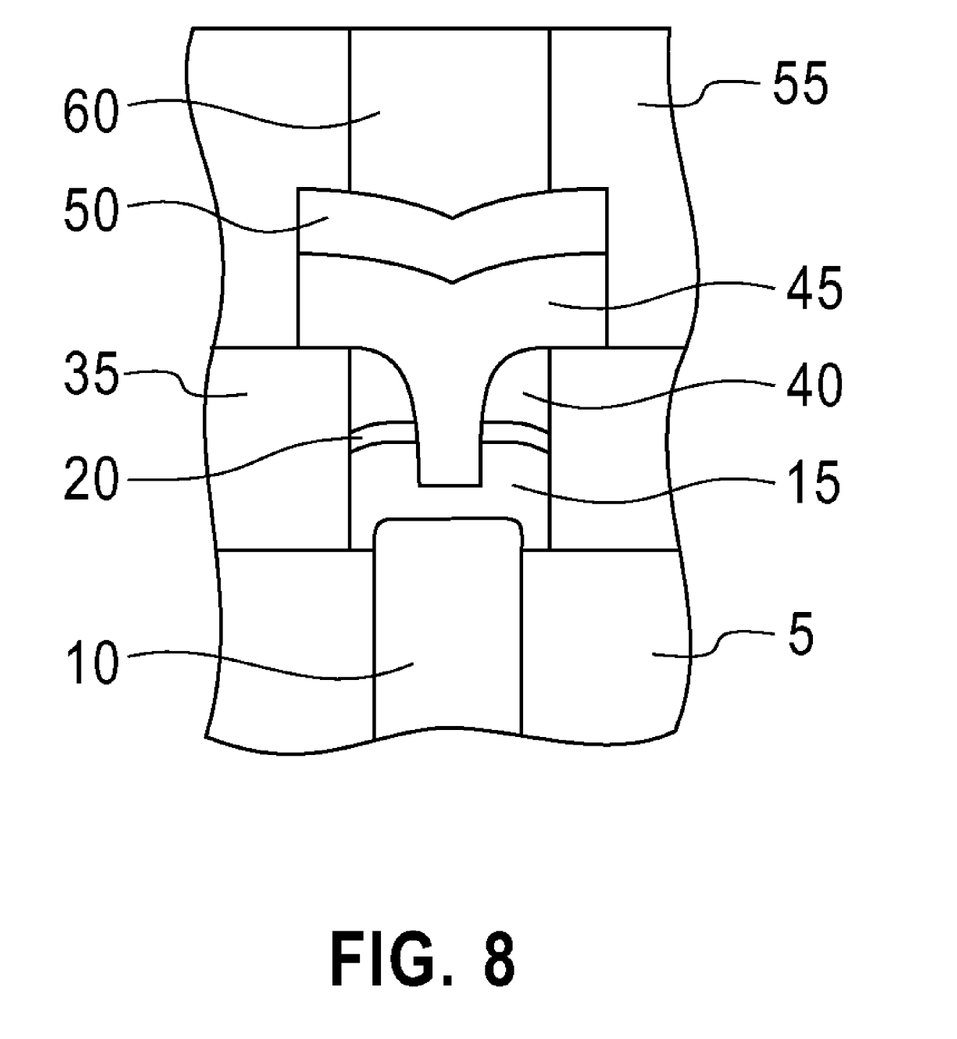
FIG. 8 is a side cross sectional view depicting forming conductive pathways in electrical communication with one embodiment of a memory device, in accordance with the present invention.

Referring to FIG. 8, and following the formation of the barrier metal/memory material stack 52, a layer of dielectric material 55 (hereafter referred to as passivation layer 55) is blanket deposited atop the structure depicted in FIG. 7. The passivation layer 55 may be selected from the group consisting of silicon-containing materials such as $SiO_2$, $Si_3N_4$, $SiO_xN_y$, SiC, SiCO, SiCOHM, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon). Additional choices for the passivation layer 55 include: any of the aforementioned materials in porous form, or in a form that changes during processing to or from being porous and/or permeable to being non-porous and/or non-permeable.

The passivation layer 55 may be formed by various methods including, but not limited to: spinning from solution, spraying from solution, chemical vapor deposition (CVD), plasma enhanced CVD (PECVD), sputter deposition, reactive sputter deposition, ion-beam deposition, and evaporation. Following deposition the blanket dielectric may be planarized to provide a planar upper surface, wherein the planarization process may include chemical mechanical planarization (CMP).

The deposited passivation layer 55 is then patterned and etched to form via holes to the memory devices 100. Following via formation, interconnects 60 are formed by depositing a conductive metal into the via holes using conventional processing, such as CVD or plating. The conductive metal may include, but is not limited to: tungsten, copper, aluminum, silver, gold, and alloys thereof.

While the present invention has been particularly shown and described with respect to the preferred embodiments thereof; it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of producing a memory device comprising:
   providing an interlevel dielectric layer including a conductive stud having a first width;
   forming a stack comprising a metal layer atop the conductive stud, and a first insulating layer overlying the metal layer;
   forming a second insulating layer atop the stack and the interlevel dielectric layer;
   planarizing the second insulating layer until an upper surface of the first insulating layer is exposed, wherein an upper surface of the second insulating layer is coplanar with the upper surface of the first insulating layer;
   removing the first insulating layer to provide a cavity;
   forming a conformal insulating layer atop the second insulating layer and the cavity;
   applying a substantially anisotropic etch step to the conformal insulating layer to produce an opening having a second width exposing an upper surface of the metal layer, wherein the first width is greater than the second width; and
   forming a memory material layer in the opening.

2. The method of claim 1, wherein the stack comprises a third width that is greater than the first width.

3. The method of claim 1, wherein the stack further includes an etch stop layer positioned between the metal layer and the first insulating layer, wherein the removing of the first insulating layer to provide the cavity includes an etch that removes the first insulating layer selective to the etch stop layer.

4. The method of claim 3, wherein the removing of the first insulating layer to provide the cavity comprises etching to remove the first insulating layer selective to the etch stop layer, wherein sidewalls of the cavity are defined by the second insulating layer and a base of the cavity is an upper surface of the etch stop layer.

5. The method of claim 3, wherein the first insulating layer is a nitride, the second insulating layer is an oxide, and the etch stop layer is an oxide.

6. The method of claim 1, wherein the forming of the memory material layer comprises depositing a phase change material.

7. The method of claim 6, wherein the phase change material is deposited by chemical vapor deposition or physical deposition.

8. The method of claim 6, wherein the phase change material comprises a chalcogenide alloy.

9. The method of claim 6, wherein the phase change material comprises Ge, Sb, Te or a combination thereof.

10. The method of claim 6 further comprising forming a baffler metal layer atop the phase change material.

11. The method of claim 10, wherein the baffler metal layer is formed by sputtering.

12. The method of claim 10, wherein the barrier metal layer comprises TiN, TaN, WN, or combinations thereof.

13. The method of claim 6 further comprising forming a blockmask atop the baffler metal layer and etching to provide a baffler metal/phase change material stack.

14. The method of claim 13 further comprising depositing a passivation layer atop the baffler metal/phase change material stack and the interlevel dielectric layer.

15. The method of claim 14, wherein the passivation layer comprises an oxide.

16. The method of claim 14 further comprising forming conductive lines through the passivation layer to contact the baffler metal/phase change material stack.

17. The method of claim 16, wherein the conductive lines are composed of copper, tungsten, aluminum, silver, gold and alloys thereof.

18. A memory device comprising:
   an electrode;
   an isolation region comprising a dielectric stack of an oxide etch stop layer atop the electrode and a nitride insulating layer present atop the oxide etch stop layer; and
   a phase change material comprising a body of a first width and an extension having a second width, wherein a portion of the extension is in direct physical contact with the electrode and the body of the phase change element is separated from the electrode by the isolation region.

19. The memory device of claim 18, wherein the first width is greater than the second width.

20. A memory device comprising:
   an electrode;
   an isolation region; and
   a phase change material comprising a body of a first width and an extension having a second width, wherein a portion of the extension is embedded in the electrode and the body of the phase change element is separated from the electrode by the isolation region.

* * * * *